United States Patent
Ripley

(10) Patent No.: US 7,385,442 B1
(45) Date of Patent: Jun. 10, 2008

(54) SYSTEM AND METHOD FOR CONSTANT BANDWIDTH DC OFFSET CORRECTION IN AN AMPLIFIER

(75) Inventor: David S. Ripley, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 79 days.

(21) Appl. No.: 11/592,948

(22) Filed: Nov. 2, 2006

(51) Int. Cl.
*H03F 1/02* (2006.01)

(52) U.S. Cl. .......................... 330/9; 327/124
(58) Field of Classification Search .............. 330/9, 330/98, 150, 254, 260, 261; 327/124, 307
See application file for complete search history.

(56) References Cited

U.S. PATENT DOCUMENTS 6,407,630 B1 * 6/2002 Yao et al. ..................... 330/9
6,456,159 B1 * 9/2002 Brewer ......................... 330/9
7,071,780 B2 * 7/2006 Van Zanten ................ 330/258

* cited by examiner

*Primary Examiner*—Henry K Choe
(74) *Attorney, Agent, or Firm*—Farjami & Farjami LLP

(57) ABSTRACT

According to one embodiment, a system for constant bandwidth DC offset correction in an amplifier includes a number of amplifier stages having an input and an output coupled together in series. The system for constant bandwidth DC offset correction further includes a number of DC offset correction feedback loops which include a variable gain transconductor coupled to an integration capacitor further coupled to a fixed gain transconductor. Each of the DC offset correction feedback loops are coupled to the input and output of each of the number of amplifier stages. The transconductance of the variable gain transconductor in each of the number of DC correction feedback loops is varied in relation to a gain of the number of amplifier stages, such that the DC offset correction feedback loops provide DC offset correction while maintaining a constant bandwidth.

20 Claims, 4 Drawing Sheets

_US 7,385,442 B1_

SYSTEM AND METHOD FOR CONSTANT BANDWIDTH DC OFFSET CORRECTION IN AN AMPLIFIER

BACKGROUND OF THE INVENTION

1. Field of the Invention

The present invention is generally in the field of circuits. More specifically, the invention is in the field of amplifier circuits.

2. Background Art

Direct conversion receiver architectures are desirable in radio designs because they are able to down-convert an incoming Radio Frequency ("RF") signal to an Intermediate Frequency ("IF") signal, thereby eliminating the need for external RF/IF filter blocks and consequently reducing the cost of the receiver. However, direct conversion receivers typically suffer from random DC offset voltages which may be caused by local oscillator self mixing and DC offsets present in the active amplifier stages. These random DC offset voltages can undesirably saturate the active amplifier stages.

In order to reduce the DC offset voltages, a feedback loop is typically used around the active amplifier stage to suppress the DC offset voltages. A conventional feedback loop operates by monitoring the output of the amplifier stage and by providing a correction voltage at the input of the amplifier stage. However, to avoid cancellation of any desired input signals, the feedback loop must be band-limited. Since the bandwidth of the feedback loop changes with the gain of the amplifier stage, the gain of the amplifier stage must remain fixed for the bandwidth of the feedback loop to remain constant. As such, in applications where the gain of the amplifier stage is continuously varied by an analog control signal, the conventional feedback loop cannot maintain a constant bandwidth to provide proper DC offset correction.

Accordingly, there is a need in the art for a system and method for DC offset correction of an amplifier using feedback loops which maintain a constant bandwidth as the gain of the amplifier is continuously varied.

SUMMARY OF THE INVENTION

The present invention is directed to a system and method for constant bandwidth DC offset correction in an amplifier. The present invention addresses and resolves the need in the art for a system and method for DC offset correction of an amplifier using feedback loops which maintain a constant bandwidth as the gain of the amplifier is continuously varied.

According to an exemplary embodiment, a system for constant bandwidth DC offset correction of an amplifier includes a number of amplifier stages coupled in series, where each of the amplifier stages includes an input and an output. For example, each two adjacent amplifier stages can be coupled together in series through a unity gain buffer amplifier. According to this embodiment, the input and output of each amplifier stage can include differential inputs and outputs. For example, each amplifier stage can include an automatic gain control ("AGC") amplifier and can be an intermediate frequency ("IF") amplifier in a direct conversion receiver ("DCR").

The system for constant bandwidth DC offset correction further includes a number of DC offset correction feedback loops. Each of the DC offset correction feedback loops include a variable gain transconductor coupled to an integration capacitor further coupled to a fixed gain transconductor, where each of the DC offset correction feedback loops are coupled to the input and output of each of the amplifier stages.

According to this embodiment, the system for constant bandwidth DC offset correction can further include a control circuit having an input and first and second outputs, where the control circuit is configured to receive a gain control signal at the input and provide a first control signal at the first output which controls the gain of the amplifier stages and a second control signal at the second output which controls the transconductance of the variable gain transconductor in each DC offset correction feedback loop. For example, the gain control signal can be an analog voltage signal and the first control signal and the second control signal can both be exponential signals which are inversely related.

According to this embodiment, the transconductance of the variable gain transconductor in each of the number of DC correction feedback loops is varied in relation to a gain of the number of amplifier stages, such that the number of DC offset correction feedback loops provide DC offset correction while maintaining a constant bandwidth. For example, the variable gain transconductor is required to provide a minimum transconductance of 500 nanosiemens (nS). Other features and advantages of the present invention will become more readily apparent to those of ordinary skill in the art after reviewing the following detailed description and accompanying drawings.

DETAILED DESCRIPTION OF THE INVENTION

The present invention is directed to a system and method for constant bandwidth DC offset correction in an amplifier. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings. It should be noted that similar numerals generally refer to similar elements in the various drawings.

Figure 1:
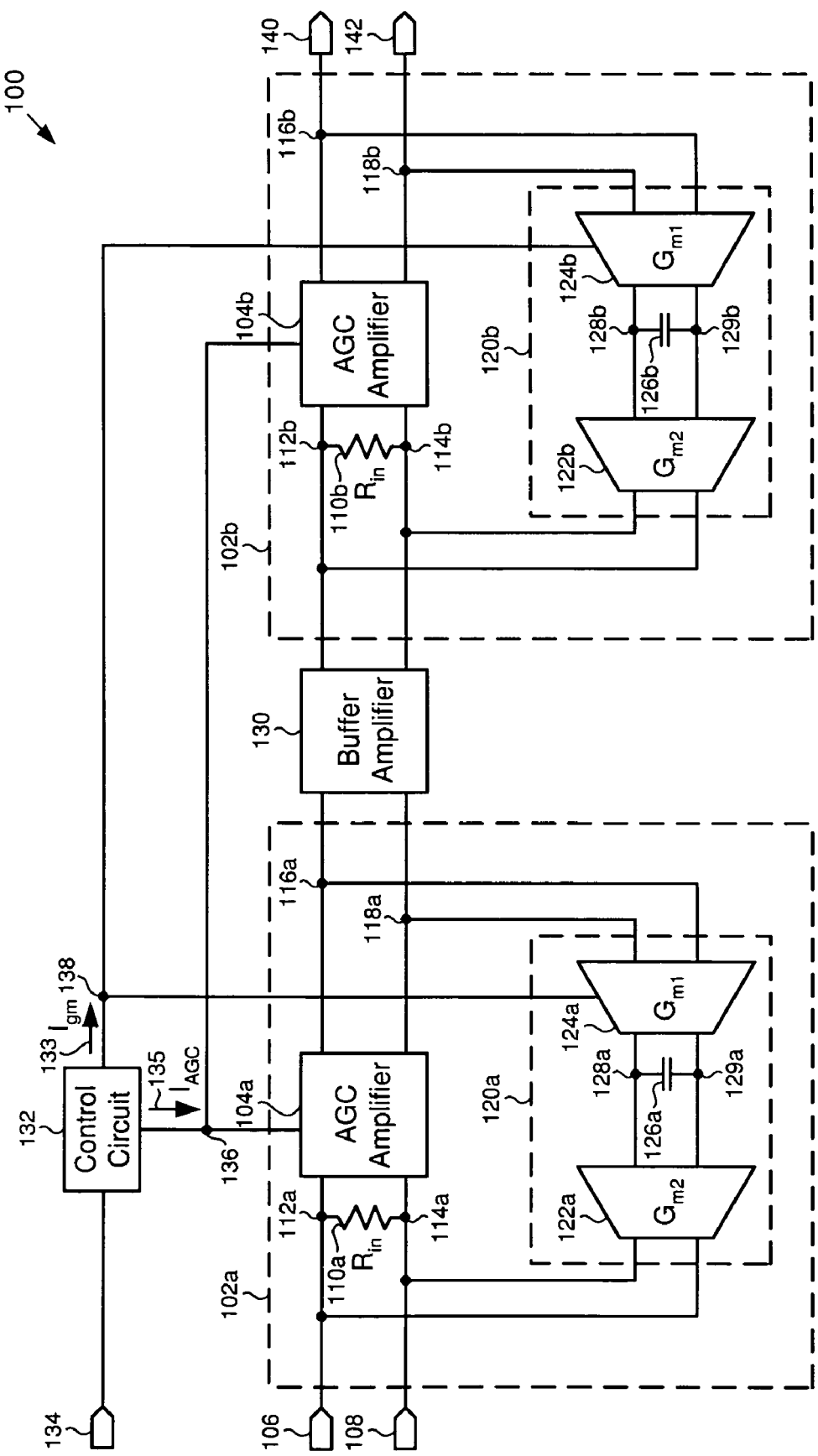
FIG. 1 illustrates a block diagram of an amplifier circuit having continuous DC offset correction at a constant bandwidth in accordance with one embodiment of the present invention.

FIG. 1 shows a block diagram of an amplifier circuit having continuous DC offset correction at a constant bandwidth in accordance with one embodiment of the present invention. Amplifier circuit 100 can be, for example, an intermediate frequency ("IF") amplifier circuit used in a direct conversion receiver ("DCR"). As shown in FIG. 1, amplifier circuit 100 includes amplifier stages 102a and 102b, buffer amplifier 130, and control circuit 132.

As shown in FIG. 1, amplifier stages 102a and 102b each include respective automatic gain control ("AGC") amplifiers 104a and 104b, DC offset correction loops 120a and 120b, and input resistors ("Rin") 110a and 110b. As also shown in FIG. 1, DC offset correction loops 120a and 120b each include respective variable gain transconductors 124a and 124b, transconductors 122a and 122b, and integration capacitors 126a and 126b. As shown in FIG. 1, amplifier stage 102a is coupled in series with amplifier stage 102b through buffer amplifier 130. Buffer amplifier 130 can be, for example, a unity gain buffer which can be used to provide isolation between amplifier stages 102a and 102b. Although the embodiment of the invention shown in FIG. 1 includes only two amplifier stages (i.e., amplifier stages 102a and 102b), it is understood that the invention can be applied to amplifier circuits having additional amplifier stages.

As shown in FIG. 1, amplifier stage 102a can receive input signals via differential inputs 106 and 108. Differential inputs 106 and 108 are coupled to the differential inputs of AGC amplifier 104a at nodes 112a and 114a, respectively. AGC amplifier 104a can be, for example, an intermediate frequency automatic gain control (IF AGC) amplifier having differential inputs and outputs. The differential outputs of AGC amplifier 104a are coupled to the differential inputs of buffer amplifier 130 at nodes 116a and 118a and the differential outputs of buffer amplifier 130 are coupled to the differential inputs of AGC amplifier 104b at nodes 112b and 114b. As shown in FIG. 1, the differential outputs of AGC amplifier 104b are coupled to differential outputs 140 and 142 at nodes 116b and 118b, respectively.

As also shown in FIG. 1, the differential outputs of AGC amplifiers 104a and 104b are coupled to respective variable gain transconductors 124a and 124b in respective DC offset correction feedback loops 120a and 120b. The differential outputs of variable gain transconductors 124a and 124b are respectively coupled to the differential inputs of transconductors 122a and 122b. As shown in FIG. 1, the first and second terminals of integration capacitor 126a are respectively coupled to nodes 128a and 129a, and the first and second terminals of integration capacitor 126b are respectively coupled to nodes 128b and 129b. The differential outputs of transconductor 122a are coupled to the differential inputs of AGC amplifier 104a at nodes 112a and 114a, respectively, and the differential outputs of transconductor 122b are coupled to the differential inputs of AGC amplifier 104b at nodes 112b and 114b, respectively.

As shown in FIG. 1, amplifier circuit 100 includes control circuit 132 which includes AGC signal input 134. Control circuit 132 further includes a first output which is coupled to variable gain transconductors 124a and 124b at node 138 and a second output which is coupled to AGC amplifiers 104a and 104b at node 136.

The gain of each amplifier stage in amplifier circuit 100 is controlled by an AGC signal, which can be an analog voltage, provided to AGC signal input 134 of control circuit 132. As such, in amplifier circuit 100, the gain of each amplifier stage, e.g., amplifier stages 102a and 102b, can be varied continuously by varying the AGC signal. For example, as shown in FIG. 1, control circuit 132 provides a first output signal, such as an AGC control current ("$I_{AGC}$") 135 to AGC amplifiers 104a and 104b and a second output signal, such as transconductance control current ("$I_{gm}$") 133 to variable gain transconductors 124a and 124b. As discussed below, the second output signal controls the transconductance of variable gain transconductors 124a and 124b in respective DC offset correction feedback loops 120a and 120b.

The operation of DC offset correction feedback loops 120a and 120b will now be discussed with reference to DC offset correction feedback loop 120a to maintain brevity. DC offset correction feedback loop 120a in FIG. 1 provides DC offset correction to amplifier stage 102a by receiving the differential output signals of AGC amplifier 104a at nodes 116a and 118a and by providing an appropriate current through resistor 110a. Thus, a voltage equal in magnitude and opposite in polarity to a DC offset voltage present at the differential inputs of AGC amplifier 104a is generated across resistor 110a and across the differential inputs of AGC amplifier 104a, which corrects the DC offset voltage existing at the differential inputs of AGC amplifier 104a.

Figure 2:
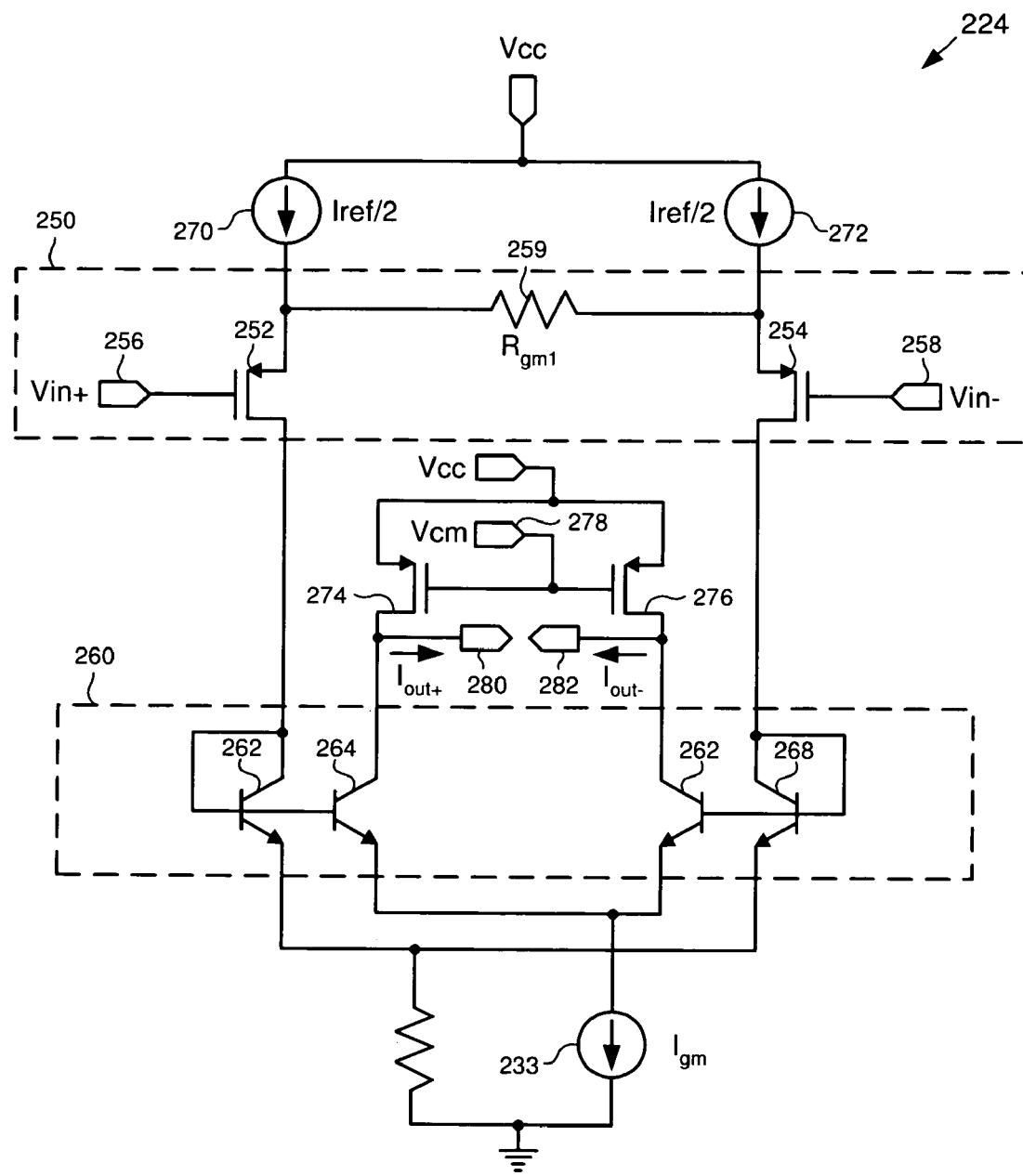
FIG. 2 illustrates a circuit diagram of a variable gain transconductor.

During operation of amplifier circuit 100, the differential output signals of AGC amplifier 104a are continuously received by DC offset correction feedback loop 120a at the differential inputs of variable gain transconductor 124a. Variable gain transconductor 124a (and variable gain transconductor 124b) in FIG. 1 can be represented by variable gain transconductor circuit 224 shown in FIG. 2. As shown in FIG. 2, variable gain transconductor circuit 224 includes voltage to current converter 250 which includes positive differential input ("Vin+") 256, negative differential input ("Vin−") 258, transistors 252 and 254, and variable gain transconductor resistor ("$R_{gm1}$") 259. Variable gain transconductor circuit 224 further includes analog multiplier 260 which includes transistors 262, 264, 266, and 268, common mode voltage input ("Vcm") 278, positive differential output current ("$I_{out+}$") 280, negative differential output current ("$I_{out-}$") 282, transistors 274 and 276, and transconductance control current source ("$I_{gm}$") 233. In exemplary variable gain transconductor circuit 224, transistors 252, 254, 274, and 276 are PFETs and transistors 262, 264, 266, and 268 are NPN bipolar transistors. Variable gain transconductor circuit 224 further includes reference current sources 270 and 272, each reference current source 270 and 272 providing approximately one-half of a reference current ("$I_{ref}$").

As shown in exemplary variable gain transconductor circuit 224 in FIG. 2, the differential output signals of AGC amplifier 102a in FIG. 1 are provided to positive differential input ("Vin+") 256 and negative differential input ("Vin−") 258 of voltage to current converter 250. In variable gain transconductor circuit 224, voltage to current converter 250 drives analog multiplier 260, which has a linear control characteristic. The gain of analog multiplier 260 can be modified by varying transconductance control current ("$_{gm}$") 233. As shown in FIG. 1, $I_{gm}$ 133 which corresponds to $I_{gm}$ 233 in FIG. 2 is controlled by the first output of control circuit 132. Therefore, the transconductance ($G_{m1}$) of variable gain transconductor circuit 224 can be represented by equation 1:

$$G_{m1} = (I_{gm})/(I_{ref} * R_{gm1}) \qquad \text{(equation 1)}$$

where $I_{gm}$ is the transconductance control current, $I_{ref}$ is the bias current for variable gain transconductor circuit 224, and $R_{gm1}$ is the resistance of variable gain transconductor resistor ("$R_{gm1}$") 259. Thus, as shown in FIG. 2, variable gain transconductor circuit 224 provides differential output currents at positive differential current output 280 and negative differential current output 282 in response to DC offset voltages sensed between positive differential input (Vin+) 256 and negative differential input (Vin−) 258 of voltage to current converter 250.

In amplifier circuit 100, the differential output currents generated by variable gain transconductor 124a flow through integration capacitor 126a to generate a voltage across integration capacitor 126a. The voltage across capacitor 126a is then provided to the differential inputs of transconductor 122a, which can be, for example, a fixed gain transconductor such as transconductor circuit 322 shown in FIG. 3.

Figure 3:
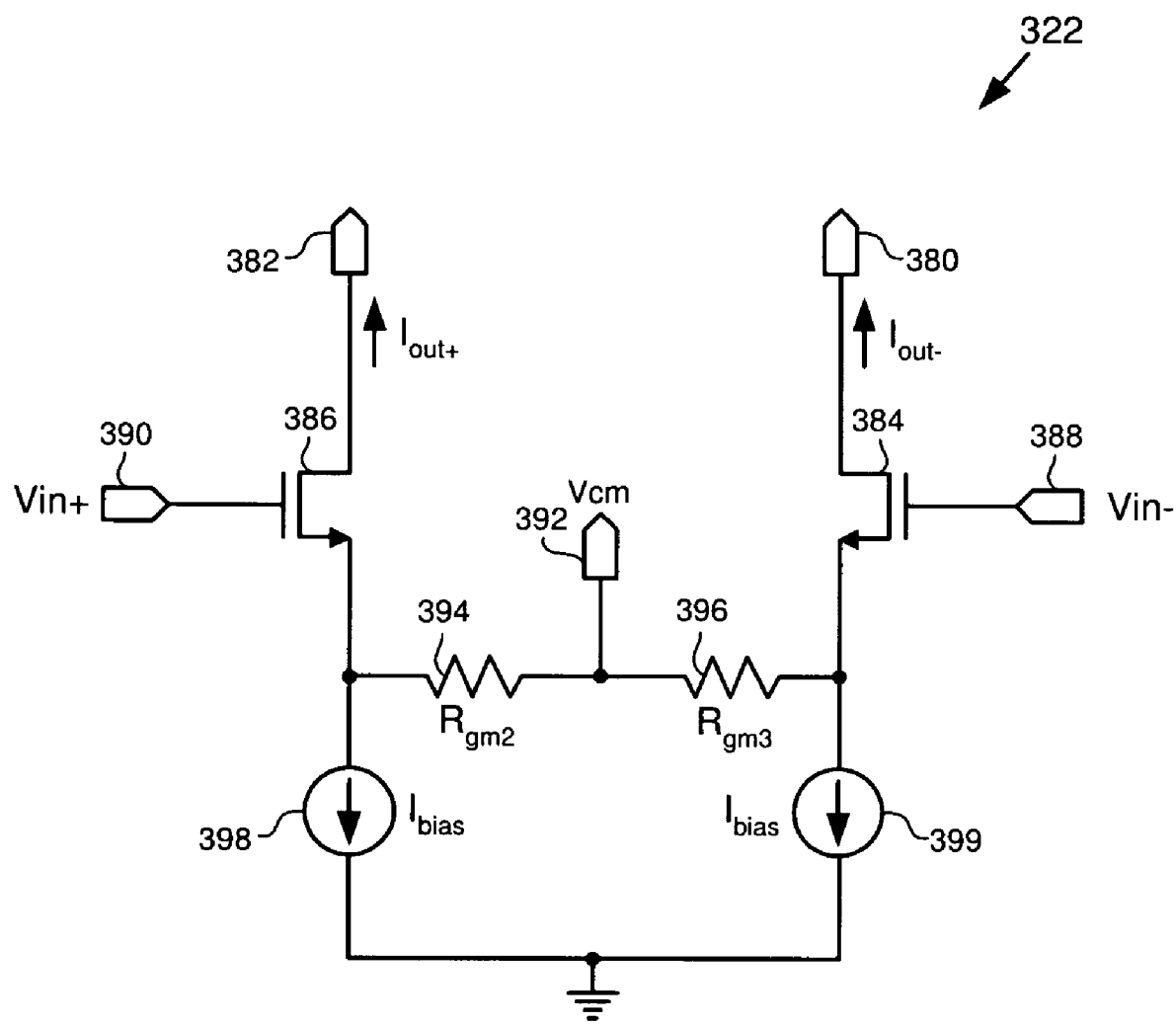
FIG. 3 illustrates a circuit diagram of a transconductor.

Transconductor circuit 322 in FIG. 3 includes transistors 384 and 386, transconductor resistor ("$R_{gm2}$") 394, transconductor resistor ("$R_{gm3}$") 396, bias current sources ("$I_{bias}$") 398 and 399, positive differential current output 382, negative differential current output 380, positive differential voltage input 390, and negative differential voltage input 388. As discussed above, the voltage across integration capacitor 126a is provided to the differential inputs, i.e., positive differential voltage input 390 and negative differential voltage input 388, of transconductor circuit 322. Transconductor circuit 322, therefore, coverts the voltage across capacitor 126a to a pair of differential output currents, such as $I_{out+}$ and $I_{out-}$ at positive differential current output 380 and negative differential current output 382, respectively. For example, transconductor circuit 322 can provide a gain of −20 db to attenuate any noise generated from variable gain transconductor 124a in FIG. 1.

Transconductor circuit 322 also provides a common mode control signal ("Vcm") at Vcm output 392, which is provided to Vcm input 278 of variable gain transconductor circuit 224 in FIG. 2, in order to reduce the common mode voltage at positive differential current output 280 and negative differential current output 282. As shown in FIG. 1, the differential output currents generated by transconductor 122a flow through resistor 110a and produce a voltage across resistor 110a and across the differential inputs of AGC amplifier 104a. The voltage across resistor 110a is equal in magnitude but opposite in polarity to a DC offset voltage present across the differential inputs of AGC amplifier 104a, thereby reducing the DC offset voltage. DC offset correction feedback loop 120a, therefore, provides negative feedback from the differential outputs of AGC amplifier 104a to the differential inputs of AGC amplifier 104a in amplification stage 102a.

By way of background, when a feedback loop is used to monitor the differential outputs of an AGC amplifier and to provide negative feedback to the differential inputs of the AGC amplifier to correct a DC offset voltage, desired input signals at the differential inputs of the AGC amplifier may be undesirably canceled. However, such cancellation of desired input signals may be avoided if the negative feedback loop is band-limited such that the desired bandwidth of the feedback loop remains constant as the gain of the AGC amplifier varies. For example, the response of feedback loop 120a can be represented by the transfer function shown in equation 2:

$$H(s) = (A_{AGC} * G_{m1} * G_{m2} * R_{in} * H(f))/(s*C)$$ (equation 2)

where $A_{AGC}$ is the gain of AGC amplifier 120a, $G_{m1}$ is the transconductance of variable gain transconductor 124a, $G_{m2}$ is the transconductance of transconductor 122a, $R_{in}$ is the resistance of resistor 110a, H(f) is the frequency response of filters used in AGC amplifier 120a (not shown in FIG. 1), and C is the capacitance of integration capacitor 126a. Since the terms $G_{m2}$, $R_{in}$, H(f), and C in equation 2 are constant, DC offset correction feedback loop 120a can maintain a constant bandwidth over different values of $A_{AGC}$ if the product of the $A_{AGC}$ and $G_{m1}$ terms remains constant.

Figure 4:
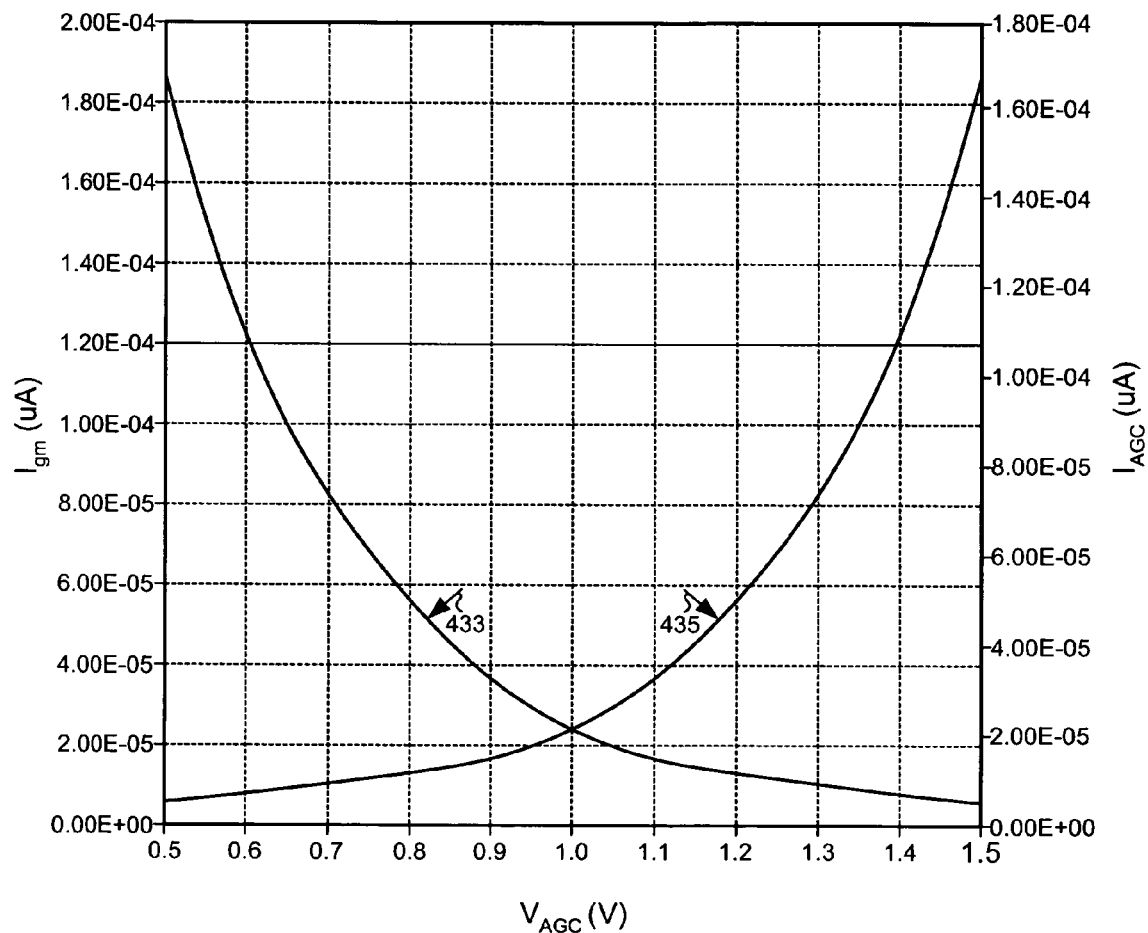
FIG. 4 illustrates exemplary first and second control output signals in accordance with one embodiment of the present invention.

As shown in FIG. 1, the first output signal of control circuit 132, i.e., $I_{AGC}$ 135, controls the gain of each AGC amplifier (e.g., AGC amplifiers 104a and 104b) in amplifier circuit 100 and the second gain control output signal, i.e., $I_{gm}$ 133, controls the transconductance of each variable gain transconductor (e.g., variable gain transconductors 124a and 124b) in respective DC offset correction feedback loops 120a and 120b. Exemplary first and second control output signals provided by control circuit 132 are shown in FIG. 4. FIG. 4 shows transconductance control current ("$I_{gm}$") 433 which can be the first output signal provided by control circuit 132 and automatic gain control current ("$I_{AGC}$") 435 which can be the second output signal. The value of the AGC signal ("$V_{AGC}$") that is provided to AGC signal input 134 of control circuit 132 is represented by the x-axis in volts ("V"). The first y-axis (which intersects the x-axis at 0.5V) represents the value of $I_{gm}$ 133 in microamperes (uA) and the second y-axis (which intersects the x-axis at 1.5V) represents the value of $I_{AGC}$ 135 in microamperes (uA).

As shown in FIG. 4, as $V_{AGC}$ increases, $I_{AGC}$ increases exponentially while $I_{gm}$ decreases exponentially, and as $I_{AGC}$ decreases exponentially, $I_{gm}$ increases exponentially. Thus, as $I_{AGC}$ is increased, the gain (i.e., the $A_{AGC}$ term in equation 2) of AGC amplifier 104a is also increased. As $I_{gm}$ is decreased, the transconductance (i.e., the $G_{m1}$ term in equation 2) of variable gain transconductor 124a is also decreased. This configuration allows the DC offset correction feedback loop of AGC amplifier 120a to provide the appropriate negative feedback voltage to the differential inputs of AGC amplifier 120a, based on the gain of AGC amplifier 120a. As shown in FIG. 4, the product of $I_{gm}$ and $I_{AGC}$ for any value of $V_{AGC}$ is a constant. Therefore, since $I_{gm}$ controls the transconductance (i.e., the $G_{m1}$ term in equation 2) of variable gain transconductor 124a and since the gain (i.e., the $A_{AGC}$ term in equation 2) is controlled by $I_{AGC}$, the product of the $G_{m1}$ and $A_{AGC}$ terms is also a constant. Thus, the response of DC offset correction feedback loop 120a represented by equation 2 above is advantageously band-limited, thereby allowing DC offset correction feedback loop 120a to provide continuous DC offset correction at a constant bandwidth even as the gain of AGC amplifier 104a is continuously varied.

Thus, since amplifier circuit 100 includes two amplifier stages, i.e., amplifier stages 102a and 102b, amplifier circuit 100 can provide a gain of 80 db by configuring each of amplifier stages 102a and 102b to provide a gain of 40 db. Since the gain of each amplifier stage 102a and 102b is substantially less than the total gain of amplifier circuit 100 (e.g., a gain of 80 db), the minimum required transconductance of each variable gain transconductor 124a and 124b for proper operation of respective DC offset correction feedback loops 120a and 120b is advantageously increased, for example, to approximately 500 nanosiemens (nS). As such, the invention allows the size of integration capacitors 126a and 126b to be advantageously decreased to provide stable and reliable integration.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, system and method for constant bandwidth DC offset correction in an amplifier have been described.

The invention claimed is:

1. A system for constant bandwidth DC offset correction in an amplifier, said system comprising:
   a plurality of amplifier stages coupled in series, each of said plurality of amplifier stages having an input and an output;
   a plurality of DC offset correction feedback loops, each of said plurality of DC offset correction feedback loops comprising a variable gain transconductor coupled to an integration capacitor further coupled to a fixed gain transconductor, wherein each of said plurality of DC offset correction feedback loops are coupled to said input and said output of each of said plurality of amplifier stages;
   wherein a transconductance of said variable gain transconductor in each of said plurality of DC correction feedback loops is varied in relation to a gain of said plurality of amplifier stages, such that said plurality of DC offset correction feedback loops provide DC offset correction while maintaining a constant bandwidth.

2. The system of claim 1, further comprising a control circuit having an input and first and second outputs, said control circuit receiving a gain control signal at said input and providing a first control signal at said first output which controls said gain of said plurality of amplifier stages and a second control signal at said second output which controls said transconductance of said variable gain transconductor.

3. The system of claim 2 wherein said first control signal and said second control signal are exponential signals which are inversely related.

4. The system of claim 1 wherein each two adjacent amplifier stages in said plurality of amplifier stages are coupled together in series through a buffer amplifier.

5. The system of claim 4 wherein said buffer amplifier is a unity gain buffer amplifier.

6. The system of claim 1, wherein said input and output of each of said plurality of amplifier stages comprise differential inputs and outputs.

7. The system of claim 2, wherein said gain control signal is an analog voltage.

8. The system of claim 1, wherein each of said plurality of amplifier stages includes an automatic gain control (AGC) amplifier.

9. The system of claim 8, wherein said automatic gain control amplifier is an intermediate frequency ("IF") amplifier in a direct conversion receiver ("DCR").

10. The system of claim 1 wherein said variable gain transconductor is required to provide a minimum transconductance of 500 nanosiemens (nS).

11. A method for constant bandwidth DC offset correction in an amplifier, said amplifier comprising a plurality of amplifier stages coupled in series, each of said plurality of amplifier stages having an input and an output and a plurality of DC offset correction feedback loops, each of said plurality of DC offset correction feedback loops comprising a variable gain transconductor coupled to an integration capacitor further coupled to a fixed gain transconductor, wherein each of said plurality of DC offset correction feedback loops are coupled to said input and said output of each of said plurality of amplifier stages, said method comprising:
   sensing a DC offset voltage at said output of each of said plurality of amplifier stages;
   varying a transconductance of said variable gain transconductor in each of said plurality of DC offset correction feedback loops in relation to a gain of said plurality of amplifier stages;
   correcting said DC offset voltage by providing a voltage equal in magnitude and opposite in polarity to said DC offset voltage;
   wherein said plurality of DC offset correction feedback loops maintain a constant bandwidth.

12. The method of claim 11, wherein said amplifier further comprises a control circuit having an input and first and second outputs, said control circuit receiving a gain control signal at said input and providing a first control signal at said first output which controls said gain of said plurality of amplifier stages and a second control signal at said second output which controls said transconductance of said variable gain transconductor.

13. The method of claim 12 wherein said first control signal and said second control signal are exponential signals which are inversely related.

14. The method of claim 11 wherein each two adjacent amplifier stages in said plurality of amplifier stages are coupled together in series through a buffer amplifier.

15. The method of claim 14 wherein said buffer amplifier is a unity gain buffer amplifier.

16. The method of claim 11 wherein said input and output of each of said plurality of amplifier stages comprise differential inputs and outputs.

17. The method of claim 12 wherein said gain control signal is an analog voltage.

18. The system of claim 11 wherein each of said plurality of amplifier stages includes an automatic gain control (AGC) amplifier.

19. The method of claim 18 wherein said automatic gain control amplifier is an intermediate frequency ("IF") amplifier in a direct conversion receiver ("DCR").

20. The method of claim 11 wherein said variable gain transconductor is required to provide a minimum transconductance of 500 nanosiemens (nS).

* * * * *